United States Patent
Sugiura et al.

(10) Patent No.: US 6,646,461 B2
(45) Date of Patent: Nov. 11, 2003

(54) METHOD AND APPARATUS FOR TESTING SEMICONDUCTOR DEVICES USING IMPROVED TESTING SEQUENCE

(75) Inventors: Kazushi Sugiura, Hyogo (JP); Katsuya Furue, Tokyo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/840,069

(22) Filed: Apr. 24, 2001

(65) Prior Publication Data

US 2002/0070746 A1 Jun. 13, 2002

(30) Foreign Application Priority Data

Dec. 11, 2000 (JP) .................................... 2000-375980

(51) Int. Cl.[7] .............................................. G01R 31/26
(52) U.S. Cl. ..................................... 324/765; 324/763
(58) Field of Search ........................... 324/73.1, 158.1, 324/763, 765; 714/718, 733, 724, 732, 736; 438/14, 17, 18; 365/201

(56) References Cited

U.S. PATENT DOCUMENTS

| 5,132,685 | A | * | 7/1992 | DeWitt et al. | 341/120 |
| 5,668,817 | A | * | 9/1997 | Adham | 714/732 |
| 5,929,650 | A | * | 7/1999 | Pappert et al. | 324/763 |
| 6,105,155 | A | * | 8/2000 | Cheng et al. | 714/736 |
| 6,108,252 | A | * | 8/2000 | Park | 365/201 |

* cited by examiner

Primary Examiner—Vinh P. Nguyen
(74) Attorney, Agent, or Firm—McDermott, Will & Emery

(57) ABSTRACT

A semiconductor device testing method is disclosed which comprises a first process 39, a second process 41 and a third process 43. In the first process 39, a test function part of a semiconductor device having a built-in self-test function is subjected to a self-diagnostic test, and a main circuit part of the device in question is tested by its test function part. If the result of either of the two tests on the device turns out to be abnormal, the device in question is rejected as defective. The test results are saved. In the second process 41, the main circuit part of each semiconductor device rejected as defective in the first process 39 is tested by use of an external test signal. If the result of the test on the semiconductor device judged faulty in the first process 39 turns out to be normal in the second process 41, then the device in question is judged normal in the third process 43.

7 Claims, 12 Drawing Sheets

METHOD AND APPARATUS FOR TESTING SEMICONDUCTOR DEVICES USING IMPROVED TESTING SEQUENCE

BACKGROUND OF THE INVENTION

1. Field of the Invention

The present invention relates to a method and an apparatus for testing semiconductor devices. More particularly, the invention relates to a testing method and a testing apparatus for preventing an inordinate drop in the yield of semiconductor devices having a built-in self-test function.

2. Description of the Related Art

As today's logic integrated circuits become progressively larger in scale, large quantities of them are fabricated in the form of semiconductor integrated circuit (IC) devices comprising a built-in self-test (BIST) function. This function is designed to test the main circuits of each semiconductor device. Traditionally, well-known automatic test equipment (ATE) such as VLSI testers has been used as standard equipment for subjecting semiconductor devices to GO/NO-GO tests ("GO" will stand for compliance with product requirements and "NO-GO" for noncompliance hereunder).

When such standard ATE is used to test IC chips having a built-in self-test (BIST) circuit each, it is customary for the equipment to test the BIST circuit of each IC chip before testing its main circuits, i.e., the proper target of testing. Because there is a possibility that the BIST circuit itself can be defective, it is necessary to test the BIST circuit first to confirm whether the BIST circuit itself is defective or not; no results of tests performed with potentially faulty BIST circuits are credible.

FIG. 12 is a flowchart of steps constituting a conventional method for testing IC chips incorporating a built-in self-test function each. In FIG. 12, one of the semiconductor devices included in a wafer is first selected. With built-in self-test mode established, the BIST circuit of the selected device is subjected to a self-diagnostic test. If the result of the self-diagnostic test is GO, then the main circuits of the device are tested by the BIST circuit. If the result of the main circuit test by the BIST circuit is GO, then the main circuits are tested without recourse to the BIST circuit. Illustratively, a memory portion of the main circuits is tested first in a test A. If the result of the test A is GO, then a logic portion of the main circuits is tested in a test B. If the result of the test B is GO, then the IC chip equipped with the built-in self-test function is judged to be normal. If any of the results from the self-diagnostic test of the BIST circuit, the main circuit test by the BIST circuit, the test A or the test B is NO-GO, the semiconductor device in question is rejected as defective at the point of the judgment. The testing of the current IC chip with the BIST circuit is stopped forthwith, and the next semiconductor device is reached for another round of tests.

One disadvantage of the conventional testing method above is that if the BIST circuit itself is faulty, the circuit can inadvertently judge the host IC chip to be defective. In such cases, the main circuits may in fact be normal but are rejected nevertheless.

Unless each BIST circuit is guaranteed 100 percent normal, there can be an inordinate decline in the yield of semiconductor devices containing the self-diagnostic circuitry in produce. For that reason, some manufacturers have eschewed the BIST scheme outright; others still adopt BISTs but with such difficulties that the tests have failed to be fully effective in the mass fabrication of semiconductor devices.

In connection with this invention, Japanese Patent Laid-Open No. 2000-131394 discloses techniques for retrieving data in user mode from desired flip-flops in an internal logic circuit through the use of a boundary scan test control circuit and scan paths for the BIST scheme.

SUMMARY OF THE INVENTION

The present invention has been made to overcome the above-described drawbacks and disadvantages, and a first object of the invention is to provide a method for testing semiconductor devices in a way that prevents a defective built-in self test function from falsely judging the host semiconductor device to be flawed.

According to one aspect of the invention, there is provided a semiconductor device testing method applied to a plurality of semiconductor devices on a wafer, each of the semiconductor devices including a main circuit part, a test function part for testing the main circuit part, and a switching circuit part for switching a test signal either to the main circuit part or to the test function part upon receipt of an external signal, the method comprising the steps of: firstly sending a test signal through the switching circuit part of a given semiconductor device to the test function part thereof thereby subjecting the test function part to a self-diagnostic and testing the main circuit part using the test function part for compliance with relevant requirements, judging the semiconductor device in question to be faulty if either the self-diagnostic of the test function part or the test on the main circuit part by the test function part has produced an abnormal result, and the result of the testing being saved; secondly supplying the main circuit part of the semiconductor device judged faulty in the first step with a test signal through the switching circuit part thereby testing the main circuit part for compliance with the requirements; and thirdly judging the semiconductor device to be normal if the main circuit part thereof was judged normal in the second step.

Accordingly, this method eliminates the possibility that any chip with normal main circuits can be rejected as defective if the result of the self-diagnostic of the built-in test function part turns out to be abnormal. The inventive testing method thus circumvents high rates of semiconductor devices getting falsely rejected because of their flawed built-in self-test circuits and thereby improves the yield rates of the devices. That in turn makes it possible to fabricate highly reliable and inexpensive semiconductor devices with the built-in self-test function.

Anther object of the invention is to provide an apparatus for testing semiconductor devices in a way that prevents a defective built-in self-test function from falsely judging the host semiconductor device to be flawed.

According to another aspect of the invention, there is provided a semiconductor device testing apparatus comprising: a drive element that carries a wafer including a plurality of semiconductor devices each having a main circuit part, a test function part for testing the main circuit part, and a switching circuit part for switching a test signal either to the main circuit part or to the test function part upon receipt of an external signal, the drive element further moving the semiconductor device of the wafer to suitable position; a signal transmission element that transmits signals to suitable semiconductor devices on the wafer carried by the drive element; and a central processing element that sends a test signal through the switching circuit part of a semiconductor device suitably positioned by the drive element, to the test function part of the device in question thereby subjecting the test function part to a self-diagnostic and testing the main circuit part using the test function part for compliance with relevant requirements, before judging the semiconductor device in question to be faulty in a first judging step if either the self-diagnostic of the test function part or the test on the main circuit part by the test function part has produced an abnormal result, the result of the testing being saved; the central processing element further moving the drive element up to the position of any semiconductor device judged faulty in the first judging step and supplying the main circuit part of the semiconductor device in question with a test signal through the switching circuit part thereby testing the main circuit part in a second judging step; the central processing element further judging the semiconductor device to be normal if the main circuit part thereof was judged normal in the second judging step.

Accordingly, This inventive testing apparatus does not reject semiconductor devices as defective if the self-diagnostic of their test function part produces an abnormal result while their main circuits are judged normal. The apparatus averts high rates of semiconductor devices getting falsely rejected because of abnormal results of the self-diagnostic on their test function part. That in turn makes it possible to fabricate highly reliable and inexpensive semiconductor devices with the built-in self-test function.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference number.

DETAILED DESCRIPTION OF THE PREFERRED EMBODIMENT

First Embodiment

A first embodiment of this invention is practiced in the form of a testing apparatus executing a first and a second process among others. In the first process, some of all semiconductor devices are selected as a group corresponding to probes of the apparatus. A built-in self-test (BIST) circuit of each of the selected devices is subjected to a self-diagnostic test, and main circuits of the device in question are tested by its BIST circuit. If the result of either of the two tests on any semiconductor device turns out to be NO-GO, then the semiconductor device in question is rejected as defective. The tests are performed on all semiconductor devices and the test results are saved. In the second process, the main circuits of all semiconductor devices rejected as defective in the first process are tested by use of an external test signal. If the result of the test on any putatively defective semiconductor device turns out to be GO, that device is regarded as normal by an overall judgment.

Figure 1:
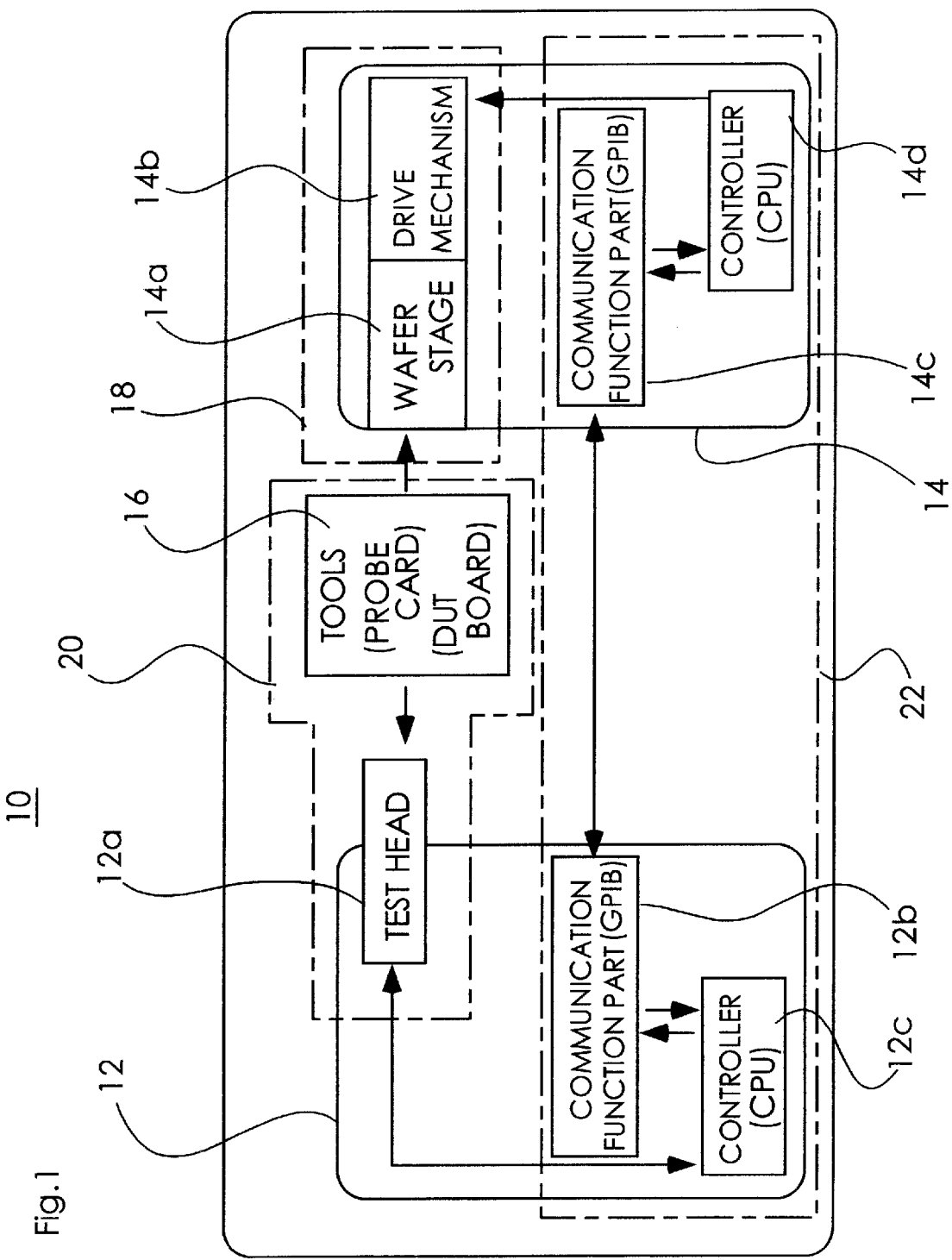
FIG. 1 is a block diagram of a semiconductor device testing apparatus in accordance with one embodiment of the invention.

FIG. 1 is a block diagram of a semiconductor device testing apparatus practiced as the first embodiment of this invention. In FIG. 1, reference numeral 10 stands for ATE; 12 for a tester of the ATE 10; 12a for a test head; 12b for a communication function part of the tester 12, such as a GPIB (General Purpose Interface Bus) interface; and 12c for a controller of the tester 12, such as a CPU.

Reference numeral 14 stands for a prober of the ATE 10; 14a for a wafer stage that carries a wafer under test; 14b for a drive mechanism that moves the wafer under test on the wafer stage 14a to a designated address; 14c for a communication function part of the prober 14, such as a GPIB interface that exchanges information with the communication function part 12b of the tester 12; 14d for a controller of the prober 14, such as a CPU; and 16 for tools attached to the test head 12a for use in the testing, such as a probe card and a DUT board.

With this structure, the controller 12c of the tester 12 and the controller 14d of the prober 14 are shown to be established separately. Alternatively, these controllers may be constituted integrally.

A block 18 enclosed by dash-dot lines represents a drive part comprising the wafer stage 14a and drive mechanism 14b. A block 20 enclosed by dash-dot line denotes a signal transmission part including the test head 12a and tools 16. A block 22 also enclosed by dash-dot line stands for a central processing part made up of the communication function part 12b, controller 12c, communication function part 14c, and controller 14d.

How the ATE 10 works will now be described. A wafer under test is placed on the wafer stage 14a. Necessary information is exchanged between the communication function parts 12b and 14c. Given the information and under control of the controller 14d, the drive mechanism 14b moves the wafer stage to a designated location.

For a multiple-chip concurrent test, a group of semiconductor devices having relevant coordinates is moved up to probes (not shown) of the tools 16 attached to the test head 12a. After the movement, the probes of the tools 16 are brought into contact with contact terminals of the semiconductor devices, such as electrode pads. With the contacting accomplished, the controller 12c sends a suitable test signal to the semiconductor devices on the wafer stage 14a to test the devices. The results of the test are returned to the controller 12c for storage. The test results are also used by the controller 12c to judge each of the semiconductor devices for compliance with predetermined requirements; compliant devices are thereby separated from noncompliant devices.

Figure 2A:
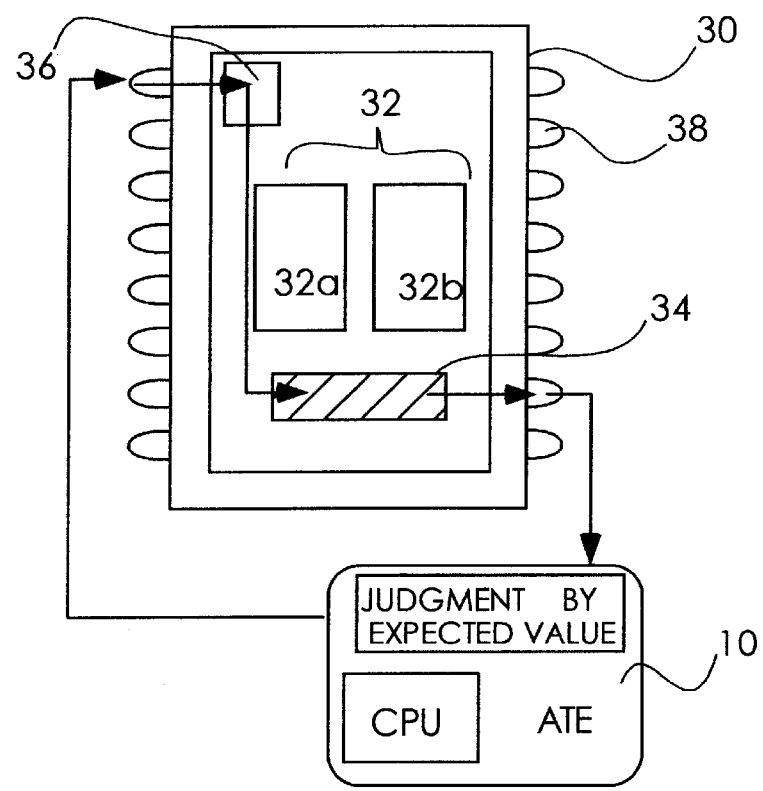
FIGS. 2A and 2B are schematic views of a semiconductor device incorporating a built-in self-test function.
Figure 2B:
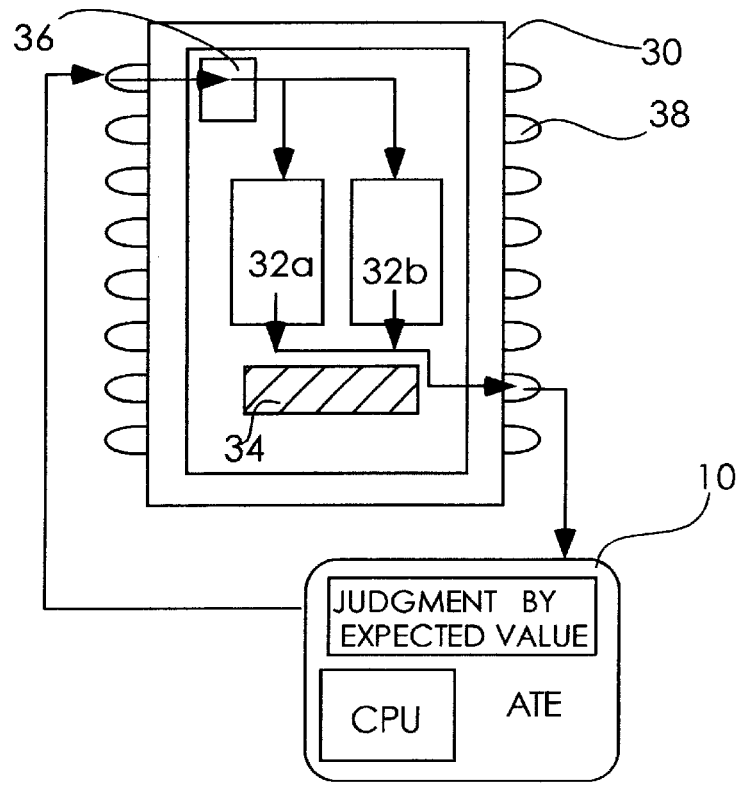

FIGS. 2A and 2B are schematic views showing how a semiconductor device incorporating a built-in self-test function switches signals. In FIGS. 2A and 2B, reference numeral 30 stands for a semiconductor device with the BIST function; 32 for a main circuit part; 32a for a memory portion of the main circuit part 32; 32b for a logic portion of the main circuit part 32; 34 for a BIST circuit acting as a test function part; 36 for a switching circuit part such as a selector circuit; and 38 for signal pins.

A signal from the ATE 10 causes the switching circuit 36 to switch the signal path to the BIST circuit 34, allowing a test signal to reach the BIST circuit 34. Given the test signal, the BIST circuit 34 performs a self-diagnostic and then tests the main circuits 32. The result of the self-test of the BIST circuit 34 and the result of the test on the main circuits 32 by the BIST circuit 34 are sent to the ATE 10. These operations are illustrated in FIG. 2A.

The self-test of the BIST circuit 34 and the test on the main circuits 32 by the BIST circuit 34 are carried out in what may be provisionally called a BIST mode.

Another signal from the ATE 10 causes the switching circuit 36 to switch the signal path to the main circuits 32, allowing a test signal from the ATE 10 to reach the main circuits 32 to be tested. The result of the test on the main circuits 32 is sent to the ATE 10. The operations are sketched in FIG. 2B.

A test mode in which an external test signal is fed to the main circuits 32 for testing without the intervention of the BIST circuit 34 is called an external signal test mode.

Figure 3:
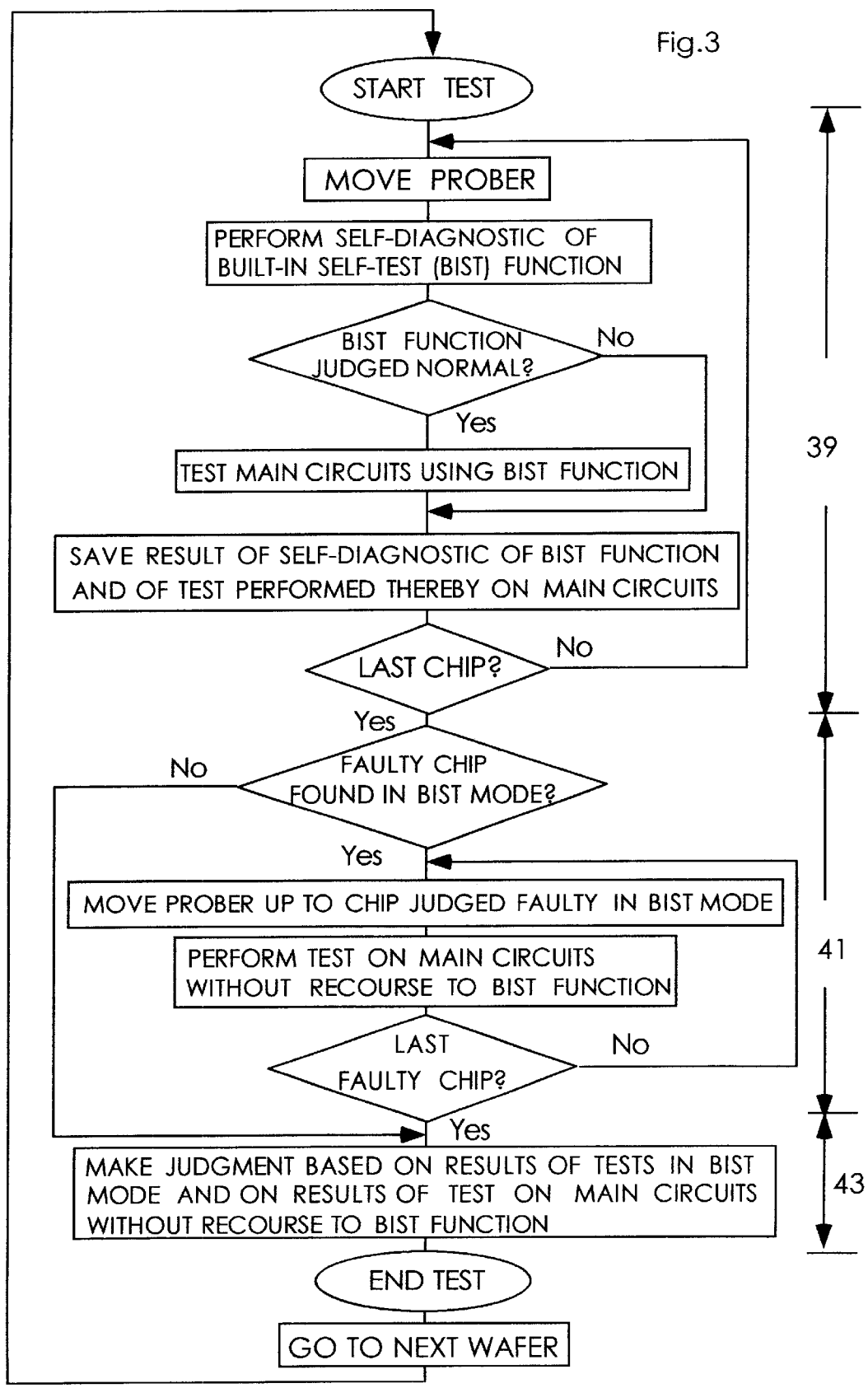
FIG. 3 is a flowchart of steps constituting a semiconductor device testing method in accordance with one embodiment of the invention.
Figure 4A:
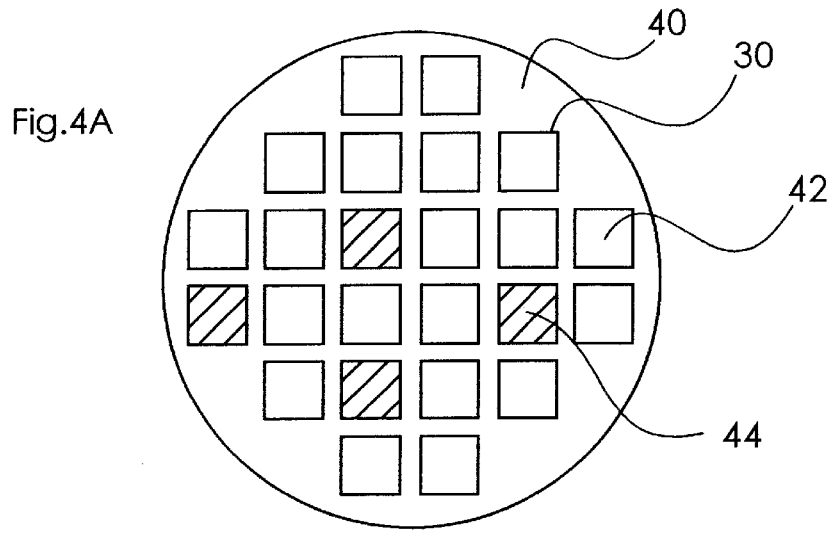
FIGS. 4A, 4B and 4C are schematic views of wafers judged to be GO or NO-GO in different steps of the inventive testing method.
Figure 4B:
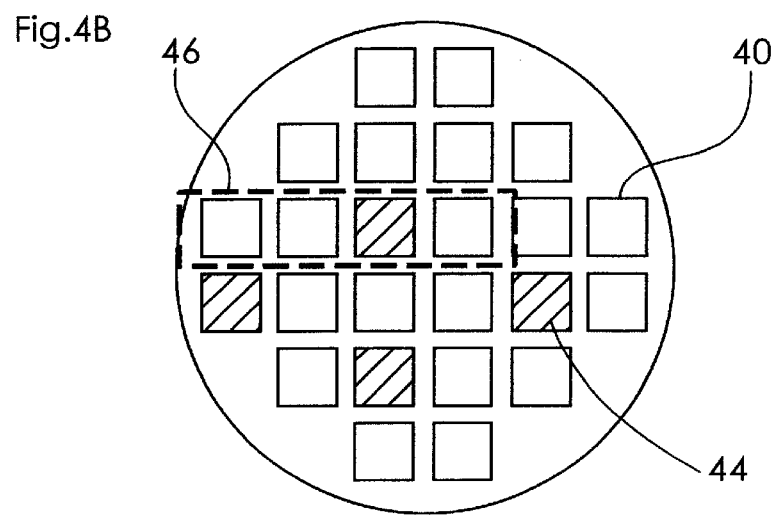
Figure 4C:
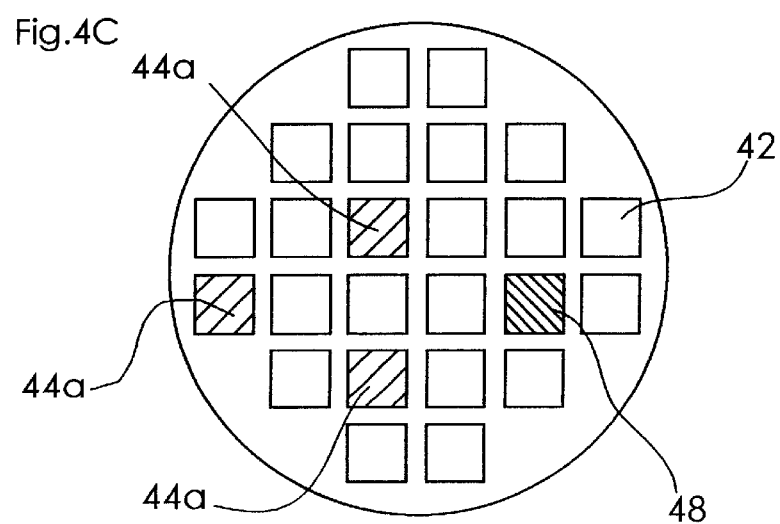

A semiconductor device testing method according to the invention will now be described. FIG. 3 is a flowchart of steps constituting the inventive semiconductor device testing method for use with the first embodiment. FIGS. 4A, 4B and 4C are schematic views of wafers judged to be GO or NO-GO in different steps of the inventive testing method.

In the flowchart of FIG. 3, a wafer is first placed on the wafer stage 14a. The prober 14 is moved up to an appropriate address. With the first embodiment, a group of semiconductor devices 30 is selected the number of which corresponds to the number of contact members (not shown) such as probes of the tools 16 attached to the test head 12a. Four semiconductor devices are illustratively selected as a group in this example. The probes are brought into contact with suitable contact terminals (not shown) of the semiconductor devices 30.

The ATE 10 sends a signal to the selector circuit 36 of a first semiconductor device 30 to be tested, whereby the signal path is switched to the BIST circuit 34 of the device. A test signal fed to the BIST circuit 34 of the semiconductor device 30 in question causes the circuit 34 to perform a self-diagnostic. If the BIST circuit 34 is judged to be normal, then the main circuits 32 are tested by the BIST circuit 34.

The test result from the BIST mode is output to the ATE 10 and judged thereby for compliance with relevant requirements before being stored. If the BIST circuit 34 is judged to be NO-GO, then that result is output to the ATE 10 without the main circuits 32 being tested by the BIST circuit 34.

If the result of either the self-diagnostic of the BIST circuit 34 or the test on the main circuits 32 by the BIST circuit 34 is abnormal, then the judgment in the BIST mode is NO-GO. Reference numeral 39 in FIG. 3 denotes steps constituting a BIST mode process performed as a first process.

FIG. 4A is a schematic view showing how a wafer is tested and judged illustratively in the BIST mode. In FIG. 4A, reference numeral 40 stands for a wafer; 42 for semiconductor devices judged to be normal in the BIST mode; and 44 for semiconductor devices judged to be abnormal in the BIST mode.

Tests in the BIST mode are carried out on all semiconductor devices 30 of the wafer 40. If no semiconductor device 40 under test is judged to be faulty in the BIST mode, the test is terminated and the next wafer is reached for another round of tests.

If any semiconductor device 44 under test in the BIST mode is judged to be faulty, the wafer stage 14a is moved up to an address that includes the semiconductor device 44 in question. The wafer stage 14a is moved in such a way that four semiconductor devices 30 selected as a single group are brought into contact with probes. FIG. 4B shows where the prober is selectively positioned. In FIG. 4B, a block 46 enclosed by broken lines denotes the selected position in which the probes contact the semiconductor devices.

The ATE 10 then transmits a signal to the selector circuit 36 of a semiconductor device 44 judged faulty upon testing in the BIST mode, thereby switching the signal path to the main circuit part 32. With the external signal test mode brought into effect, the main circuits 32 comprising the memory portion 32a and logic portion 32b are tested. The result of the test on the main circuits in the external signal test mode is sent to the ATE 10. The test is carried out on all semiconductor devices 44 that were judged faulty in the BIST mode. In FIG. 3, reference numeral 41 represents steps constituting an external signal test mode process performed as a second process.

The results of the test in the BIST mode and of the test in the external signal test mode are put together for an overall judgment. Specifically, of the semiconductor devices 44 judged faulty in the BIST mode, those judged normal by the main circuit test in the external signal test mode are ultimately judged acceptable. In FIG. 3, reference numeral 43 stands for steps constituting an overall judgment process performed as a third process.

FIG. 4C is a schematic view showing how the wafer is subjected to an overall judgment. Reference numeral 44a denotes semiconductor devices found normal in the overall judgment, and numeral 48 represents a semiconductor device ultimately judged faulty. The criteria for the judgment are summarized as follows:

(1) If the result of the self-diagnostic of the BIST circuit is NO-GO, no test is performed on the main circuits 32 by the BIST circuit. In this case, if the result of the test on the main circuits in the external signal test mode is GO, the overall judgment on the device in question is GO.

(2) If the result of the self-diagnostic of the BIST circuit is NO-GO, no test is performed on the main circuits 32 by the BIST circuit. In this case, if the result of the test on the main circuits in the external signal test mode is NO-GO, the overall judgment on the device in question is NO-GO.

(3) If the result of the self-diagnostic of the BIST circuit is GO and if the result of the test on the main circuits 32 by the BIST circuit is GO, then no test is performed on the main circuits in the external signal test mode. In that case, the overall judgment on the device in question is GO.

(4) If the result of the self-diagnostic of the BIST circuit is GO and if the result of the test on the main circuits 32 by the BIST circuit is NO-GO, then no test is performed on the main circuits in the external signal test mode. In that case, the overall judgment on the device in question is NO-GO.

Figure 5:
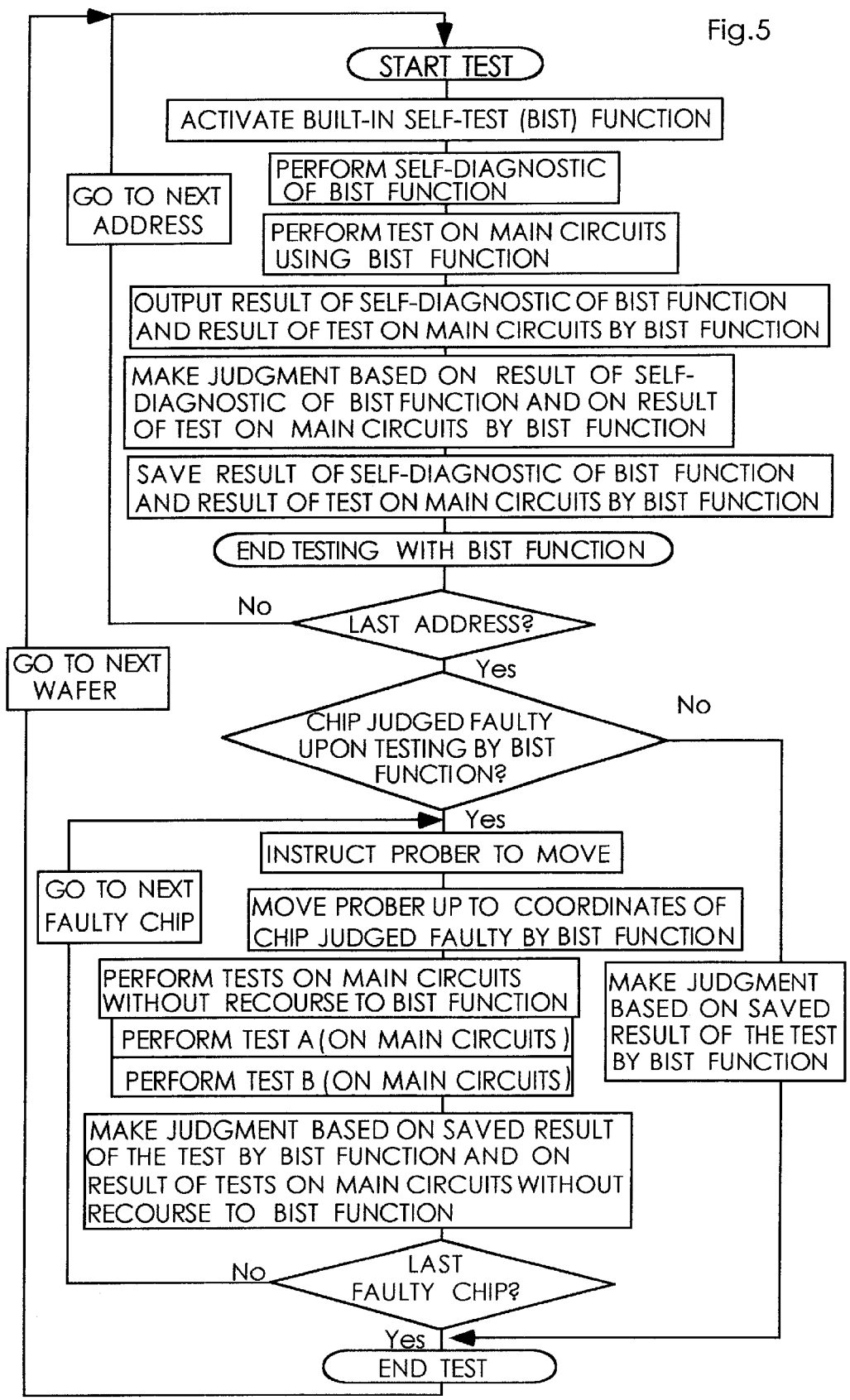
FIG. 5 is a flowchart of detailed steps constituting the semiconductor device testing method in accordance with one embodiment of the invention.

FIG. 5 is a flowchart of steps constituting the semiconductor device testing method of the invention. Although the flowchart in FIG. 5 is more detailed than that in FIG. 3, they indicate basically the same procedure.

In FIG. 5, "Test A" denotes a test carried out on the memory portion 32a of the main circuit part 32 in the first embodiment, and "Test B" represents a test on the logic portion 32b of the same part. Alternatively, the test A may be performed on a first memory and the test B on a second memory. As another alternative, the test A may be carried out on a memory and the test B on an analog circuit.

A signal is first sent to the selector circuit 36 of an initially selected semiconductor device 30. This switches the signal path to the BIST circuit 34 (and activates the built-in self-test function). The self-diagnostic of the BIST circuit is performed, and the main circuits are tested by the BIST circuit. The result of the self-diagnostic of the BIST circuit and the result of the main circuit test performed thereby (in the BIST mode) are output. Compliance of the semiconductor device in question is first judged on the basis of the result from the test in the BIST mode, and the judgment on the device based on the test result of the BIST mode is saved into storage. The operations are carried out on all chips. At the prober 14, the wafer stage 14a is positioned successively to all addresses involved. If no chip is judged faulty upon testing in the BIST mode, the overall judgment is GO.

If a defective chip is found upon testing in the BIST mode, the prober 14 is given a move instruction. The prober 14 then moves the wafer stage 14a up to an address that includes the chip found faulty in the BIST mode. After this, the main circuits are tested for compliance in the test A and test B without the intervention of the BIST circuit (i.e., in the external signal test mode). The wafer stage 14a is moved successively until it reaches the address that contains the last chip judged faulty upon testing in the BIST mode. The saved test results from the BIST mode and those from the external signal test mode are then put together for an overall judgment.

Figure 6:
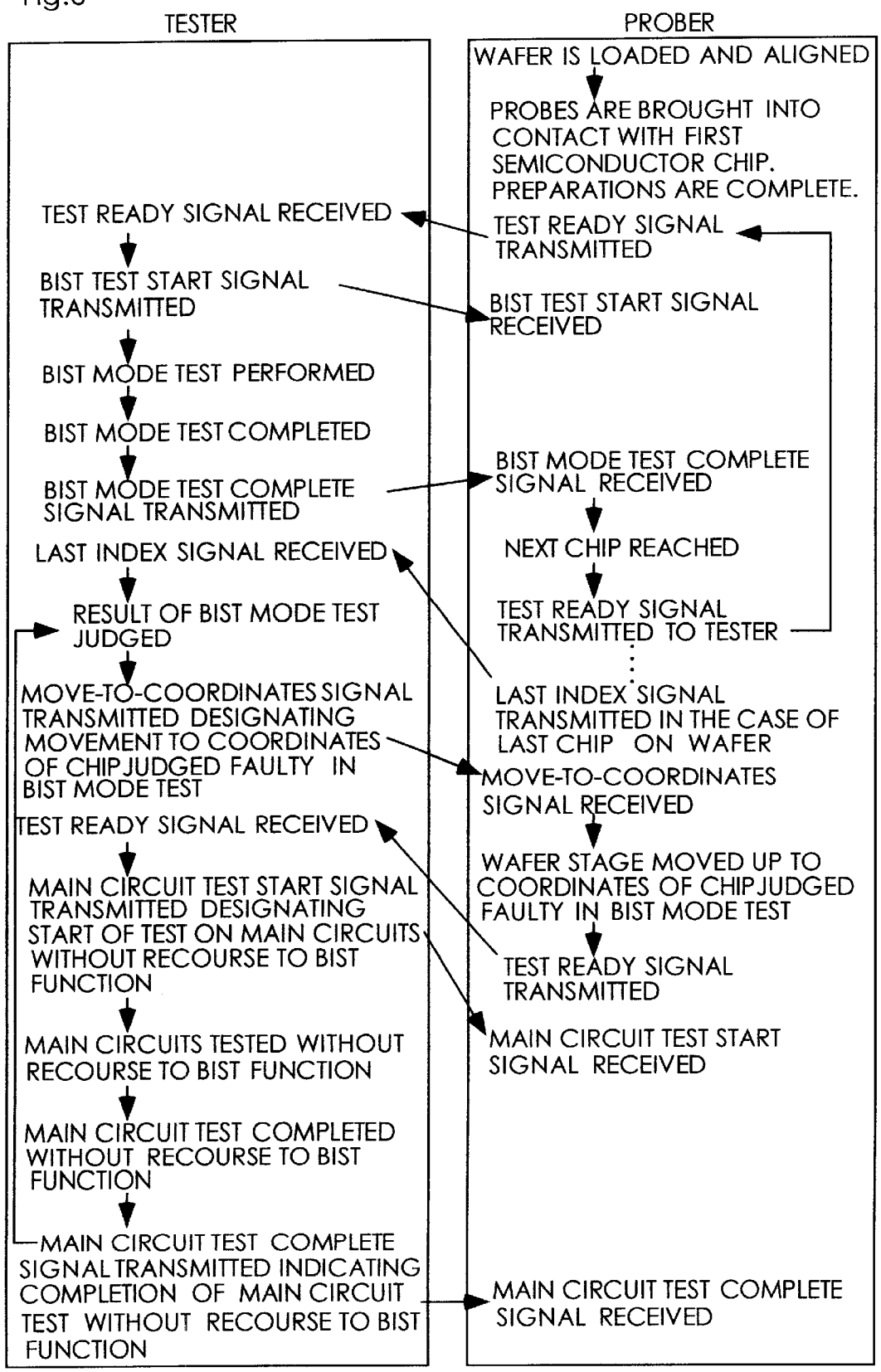
FIG. 6 is a flowchart of steps representing communications exchanged between a tester and a prober in the testing apparatus in accordance with one embodiment of the invention.

FIG. 6 is a flowchart of steps representing communications exchanged between a tester and a prober in the testing apparatus of the invention.

The figure picks up, from the test procedure in FIGS. 3 and 5, detailed steps in which signals are transmitted and received successively in a coordinated manner between the test head 12a of the tester 12 and the drive mechanism 16 of the prober 14.

A wafer is first loaded and aligned. Probes are brought into contact with a first semiconductor chip on the wafer. With the preparations for testing thus completed, the prober 14 sends a test ready signal to the tester 12. The tester 12 receives the test ready signal, transmits in response a BIST test start signal to the prober 14, and performs a test in the BIST mode. With the BIST mode test completed, the tester transmits a BIST mode test complete signal to the prober 14. On receiving the BIST mode test complete signal, the prober 14 moves to the next chip and transmits a test ready signal to the tester 12. The steps above are repeated until all chips have been reached and tested.

When the BIST mode test is completed on the last chip of the wafer, the prober 14 transmits a last address signal to the tester 12. Upon receipt of the last address signal, the tester 12 judges the result of the BIST mode test and transmits to the prober 14 a move-to-coordinates signal designating the movement to the coordinates of a chip found faulty in the BIST mode test. On receiving the move-to-coordinates signal, the prober 14 moves the wafer stage 14a up to the address that contains the chip found faulty in the BIST mode test and transmits a test ready signal to the tester 12. Given the test ready signal, the tester 12 transmits to the prober 14 a main circuit test start signal designating the start of a test on the main circuits in the external signal test mode without recourse to the BIST function. Upon completion of the main circuit test in the external signal test mode, the tester 12 transmits to the prober 14 a main circuit test complete signal indicating the completion of the main circuit test in the external signal test mode. The prober 14 receives the main circuit test complete signal thus transmitted.

The tester 12 then transmits to the prober 14 a move signal designating the movement to the coordinates of the next chip judged faulty in the BIST mode test. The steps above are repeated until the last faulty chip is reached and tested.

As described, the testing method for use with the testing apparatus of the first embodiment comprises the first and the second process which are performed in a simplified manner. In the first process, a group of semiconductor devices is selected corresponding to the probes of the apparatus. The built-in self-test (BIST) circuits of the selected devices are subjected to self-diagnostic tests, and main circuits of the devices are tested by their BIST circuits. The tests are performed on all semiconductor devices and the test results are saved. In the second process, the main circuits of all semiconductor devices judged faulty in the first process are tested by use of an external test signal. If the result of that test on any putatively defective semiconductor device turns out to be normal, the device in question is regarded as normal by an overall judgment. The inventive method eliminates the possibility that any chip with normal main circuits can be rejected as defective because of a faulty BIST function.

The inventive testing method thus circumvents high rates of semiconductor devices getting falsely rejected because of their flawed BIST circuits and thereby improves the yield rates of the devices.

The testing apparatus of the first embodiment, used in conjunction with the inventive method, is prevented from falsely rejecting semiconductor devices with the BIST function. Thus it is possible to judge properly.

The apparatus and the method of the invention combine to provide processes whereby semiconductor devices with the BIST function are fabricated at reduced costs.

Second Embodiment

A second embodiment of this invention involves initially selecting a group of semiconductor devices corresponding to the probes of the testing apparatus. The built-in self-test (BIST) circuit of each selected device is subjected to a self-diagnostic test, and the main circuits of the device are tested by its BIST circuit. If the result of one of the two tests turns out to be abnormal, the device in question is rejected as defective. The test results are saved. The rejected semiconductor devices, with their contact members still in position, are further subjected to a main circuit test using an external test signal. If the main circuits of any initially rejected semiconductor device are judged to be normal upon testing, that device is accepted as normal by an overall judgment. The steps above are repeated on all semiconductor devices involved.

Figure 7:
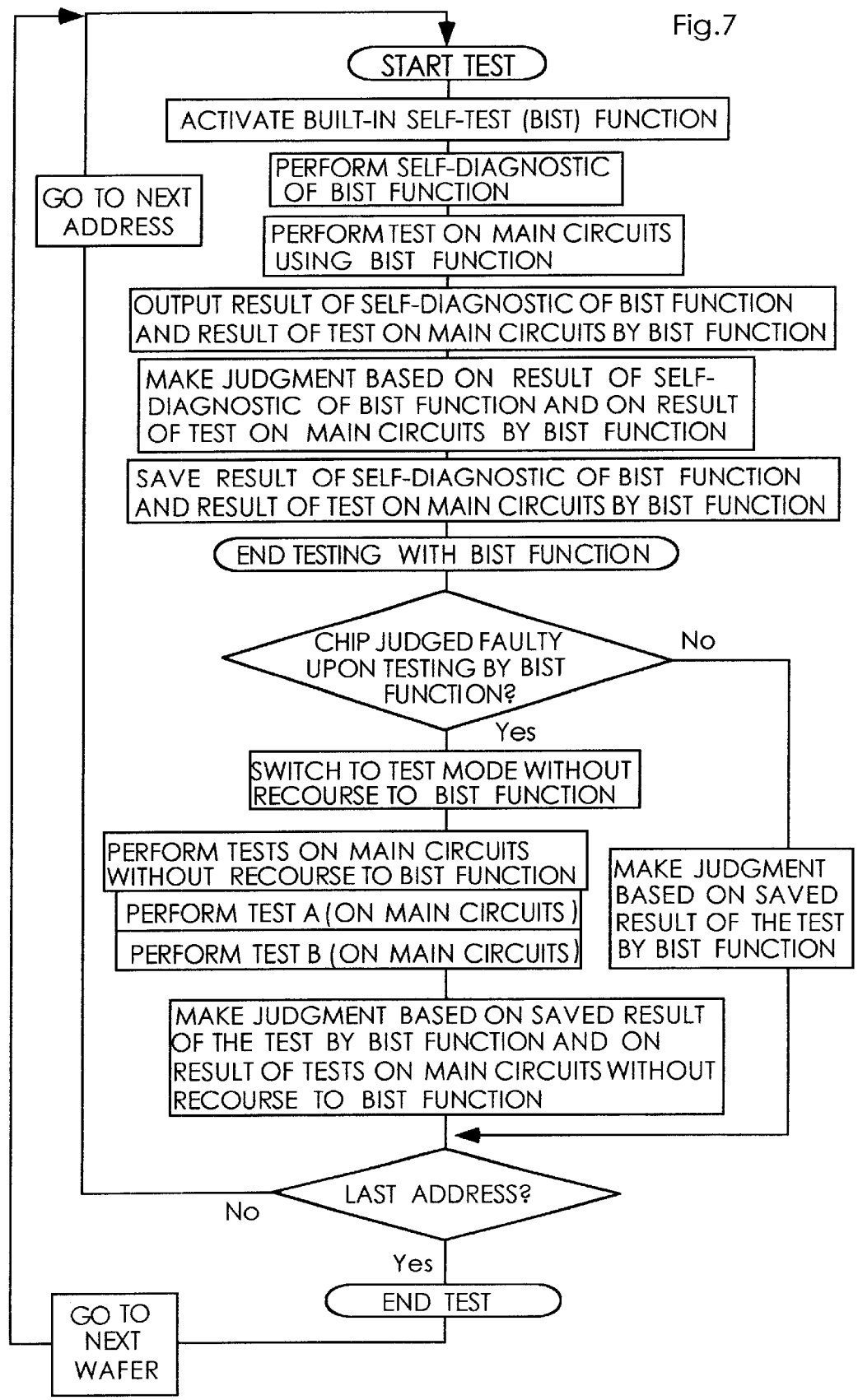
FIG. 7 is a flowchart of steps constituting another semiconductor device testing method in accordance with one embodiment of the invention.

FIG. 7 is a flowchart of steps constituting a semiconductor device testing method implemented as the second embodiment of this invention. Referring to FIG. 7, a wafer is first placed onto the wafer stage 14a, and the prober 14 is moved into place. As with the first embodiment, the second embodiment brings contact members (not shown) such as probes of the tools 16 attached to the test head 12a into contact with contact terminals (not shown) of a group of, say, four semiconductor devices 30 corresponding to the number of the probes.

The ATE 10 then sends a signal to the selector circuit 36 of the semiconductor device 30 under test to switch the signal path to the BIST circuit 34 (and activate the BIST function). Another signal sent to the BIST circuit 34 puts the BIST circuit 34 of the semiconductor device 30 to a self-diagnostic. If the BIST circuit 34 is judged normal, then the main circuits 32 are tested by the BIST circuit 34.

As with the first embodiment, the self-diagnostic of the BIST circuit 34 and the test on the main circuits 32 by the BIST circuit 34 are carried out in what is called the BIST mode.

The results of tests in the BIST mode are output to the ATE 10 for storage. If either the self-diagnostic of the BIST circuit 34 or the test on the main circuits 32 by the BIST circuit 34 yields an abnormal result in the BIST mode, the device in question is judged faulty.

If the current semiconductor device 30 is judged normal in the BIST mode, the testing is terminated and the next semiconductor device is reached for another round of tests. If any semiconductor device 44 is judged defective upon testing in the BIST mode, the probes are kept in place while the ATE 10 sends a signal to the selector circuit 36 of the semiconductor device 44 judged faulty in the BIST mode. With the signal path thus switched to the main circuit part 32, the main circuits (i.e., memory portion 32a and logic portion 32b) are tested in the external signal test mode. The results of the tests in the external signal test mode are transmitted to the ATE 10.

As described, if any semiconductor device 44 is judged faulty in the BIST mode, the probes are kept in place while the main circuits 32 of the device in question are tested successively in the external signal test mode. This testing process is repeated at all addresses to which the wafer stage is positioned. The saved test results from the BIST mode and those from the external signal test mode are then put together for an overall judgment. The criteria for judgment with the second embodiment are the same as those with the first embodiment.

In addition to the benefits offered by the first embodiment, the second embodiment reduces the number of times the prober 14 moves the wafer stage 14a and thereby shortens the overall processing time taken per wafer. Because the number of times chips are brought into contact with the probes is reduced, any damage to the contact terminals is minimized. Furthermore, the second embodiment makes it possible to fabricate highly reliable and inexpensive semiconductor devices with the BIST function through significantly shorted processes.

Third Embodiment

A third embodiment of this invention is practiced in the form of a testing method involving a first and a second process. In the first process, all semiconductor devices on a wafer are selected collectively. The test function part of each selected device is subjected to a self-diagnostic test, and the main circuit part of the device in question is tested by its test function part. If the result of either of the two tests on any semiconductor device turns out to be abnormal, then the device in question is rejected as defective. The test results are saved. In the second process, the main circuit part of each semiconductor device rejected as defective in the first process is tested separately by use of an external test signal. If the result of the test on any putatively defective semiconductor device turns out to be normal, that device is regarded as normal by an overall judgment.

Figure 8:
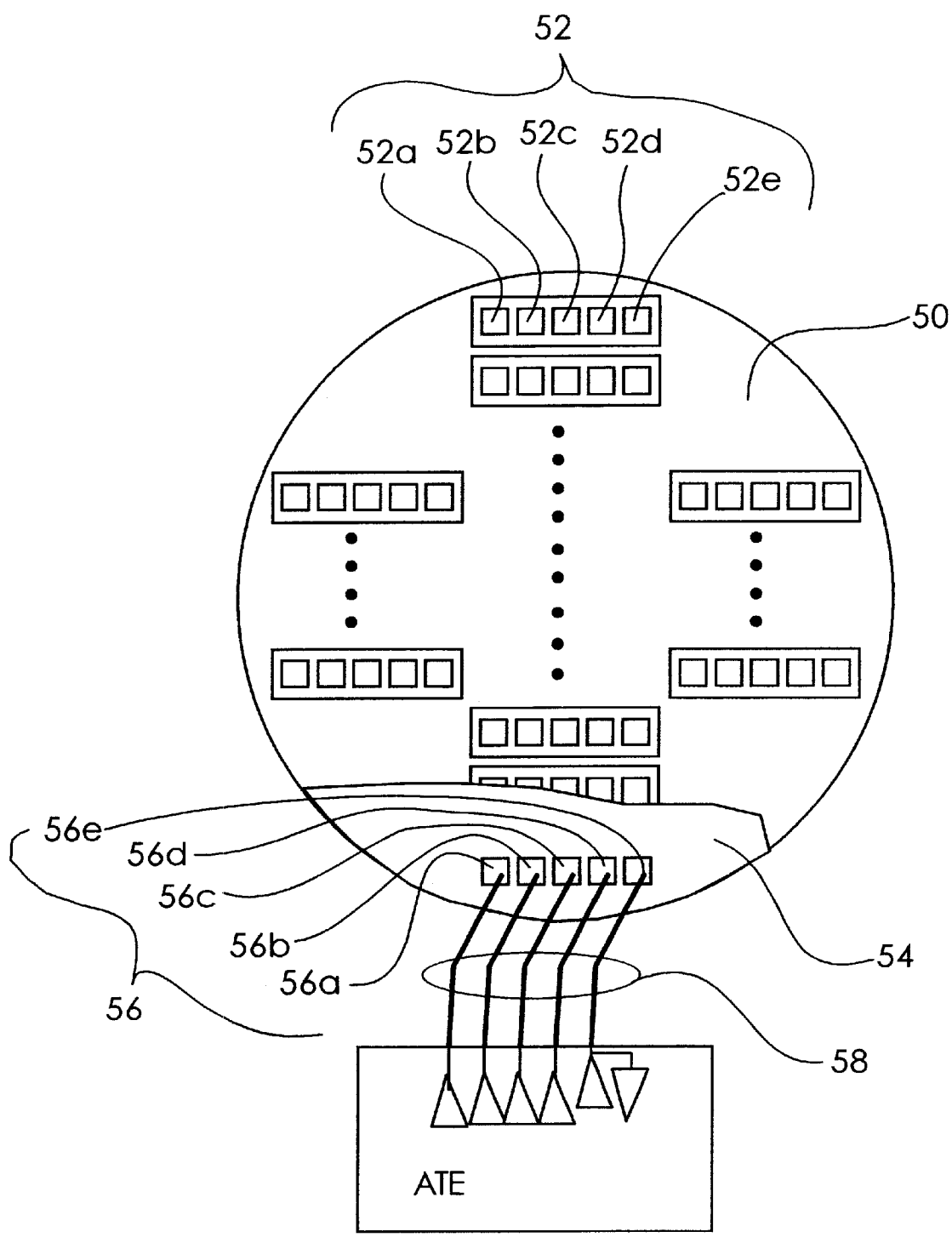
FIG. 8 is a schematic view of testing tools in accordance with one embodiment of the invention.

FIG. 8 is a partially cutaway schematic view of testing tools for use with the testing method of the third embodiment. In FIG. 8, reference numeral 50 stands for a first contact sheet on which are formed contact bumps 52 (52a, 52b, 52c, 52d, 52e) corresponding to the pads of all semiconductor devices 30. The contact bumps 52 are formed so as to be in contact with the pads of each semiconductor device 30. A second contact sheet 54 is placed over the first contact sheet 50. It is the second contact sheet 54 that is shown partially cutaway in FIG. 8.

Reference numeral 56 (56a, 56b, 56c, 56d, 56e) denotes a common contact formed on the second contact sheet 54. They are connected respectively to the contact bumps 52a, 52b, 52c, 52d and 52e of the first contact sheet 50 through wiring (not shown) furnished on the second contact sheet 54. Reference numeral 58 denotes probes in FIG. 8.

Figure 9:
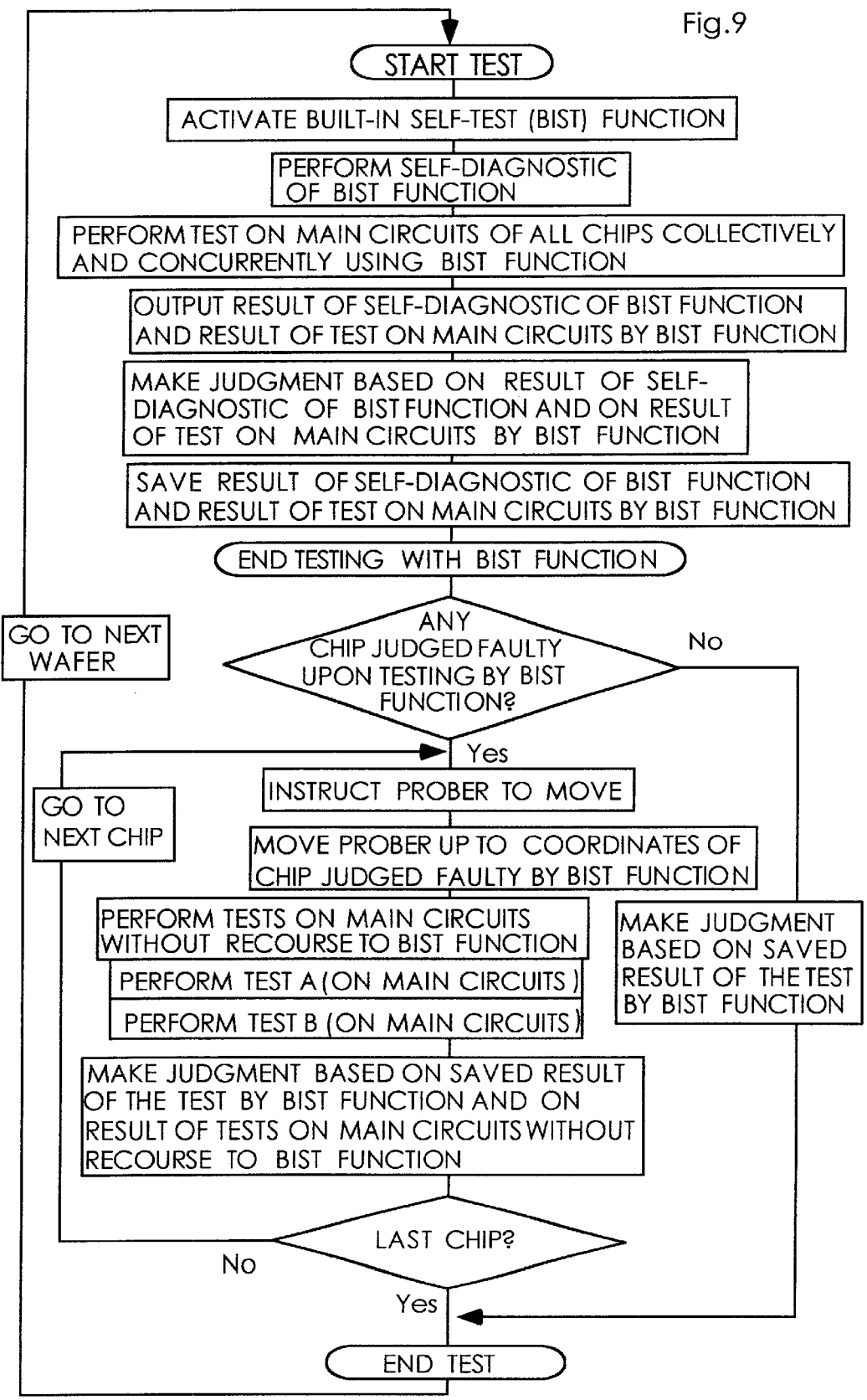
FIG. 9 is a flowchart of steps constituting another semiconductor device testing method in accordance with one embodiment of the invention.
Figure 10A:
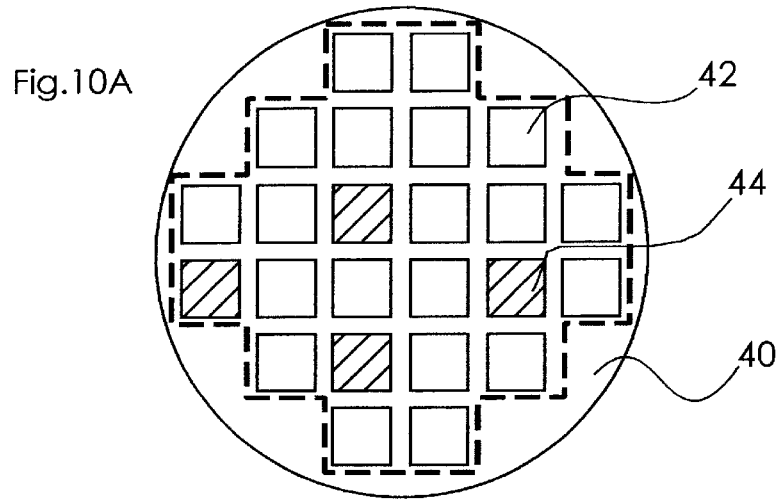
FIGS. 10A, 10B and 10C are schematic views of wafers judged to be GO or NO-GO in different steps of the inventive testing method.
Figure 10B:
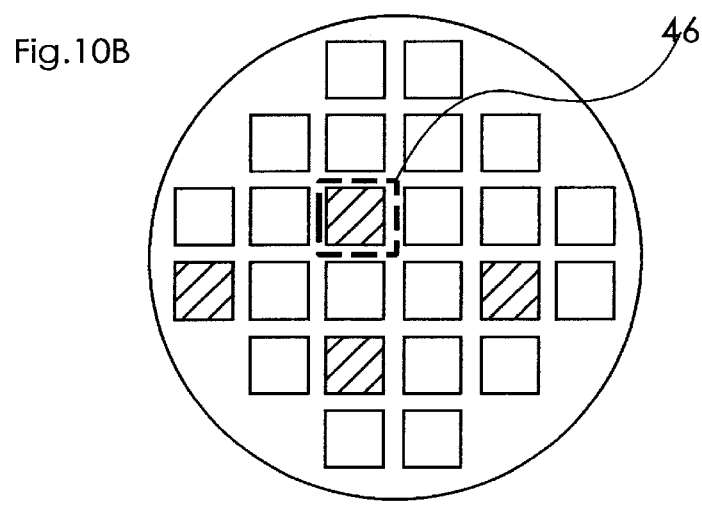
Figure 10C:
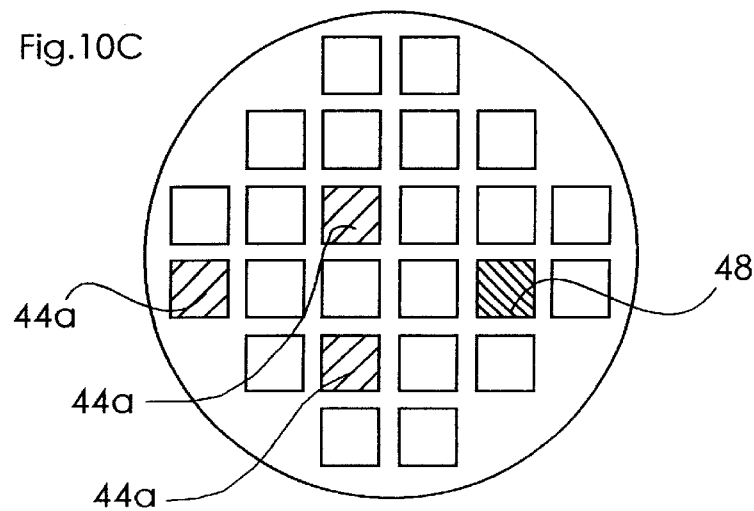

FIG. 9 is a flowchart of steps constituting the semiconductor device testing method implemented as the third embodiment of the invention. FIGS. 10A, 10B and 10C are schematic views of wafers judged to be GO or NO-GO in different steps of the inventive testing method.

Referring to FIG. 9, a wafer is first placed on the wafer stage 14a. The wafer stage 14a is moved to a designated wafer stage address under control of the controller 14d. The first and the second contact sheet 50 and 54 are used as testing tools for the wafer in such a manner that all chips on the wafer may be tested with a single pad contact.

The probes 58 of the tools 16 attached to the test head 12a are then brought into contact with the common contact 56 of the second contact sheet 54. The ATE 10 sends a signal to the selector circuits 36 of all semiconductor devices 30 to switch their signal path to the BIST circuit 34. Another signal is sent to the BIST circuit 34 to subject the BIST circuits of the semiconductor devices 30 to a collective self-diagnostic. If the BIST circuits 34 are judged to be normal, then the main circuits 32 are tested by the BIST circuits 34.

The results of the tests performed on all semiconductor devices 30 in the BIST mode are output successively to the ATE 10 for storage.

If any BIST circuit 34 is judged to be NO-GO upon testing, then the main circuits 32 are not tested by the BIST circuits 34. The result of the test is output to the ATE 10. If either the self-diagnostic of the BIST circuits 34 or the test on the main circuits 32 by the BIST circuits 34 yields an abnormal result in the BIST mode, the semiconductor devices are judged faulty. FIG. 10A is a schematic view showing a wafer tested and judged in the BIST mode. In FIG. 10A, a region enclosed by broken lines represents the range subject to the collective testing in the BIST mode.

If no semiconductor device is judged faulty in the BIST mode, the testing is brought to an end. The next wafer is then reached for another round of tests.

If any semiconductor device 44 is judged faulty upon testing in the BIST mode, then the wafer stage 14a is moved up to an address where the probes 58 come into contact with the semiconductor device 44 in question. FIG. 10B shows illustratively how the prober is selectively positioned. In FIG. 10B, a portion 46 enclosed by broken lines denotes the selected position where the probes contact the semiconductor device.

Figure 11:
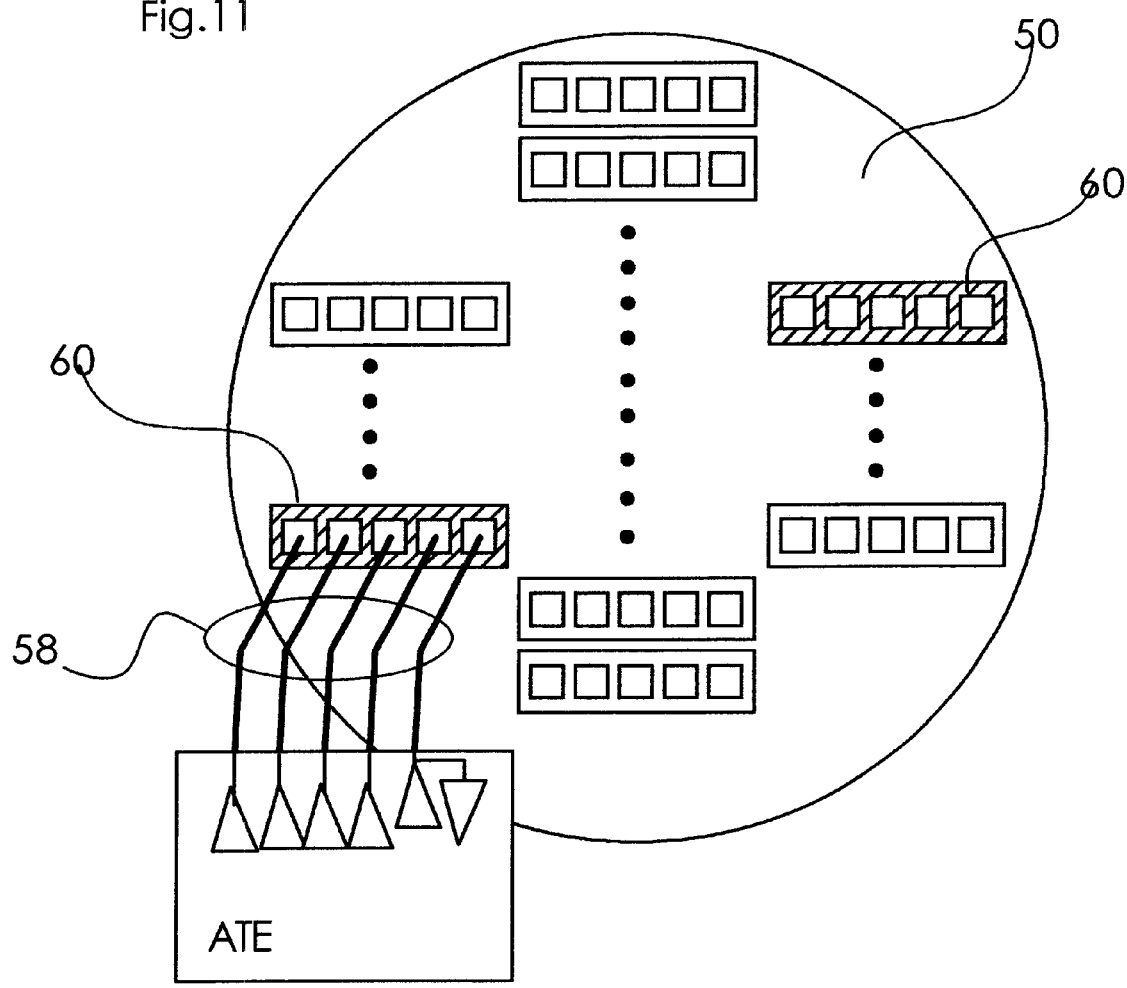
FIG. 11 is a schematic view showing how the inventive testing tools are in contact with probes.
Figure 12:
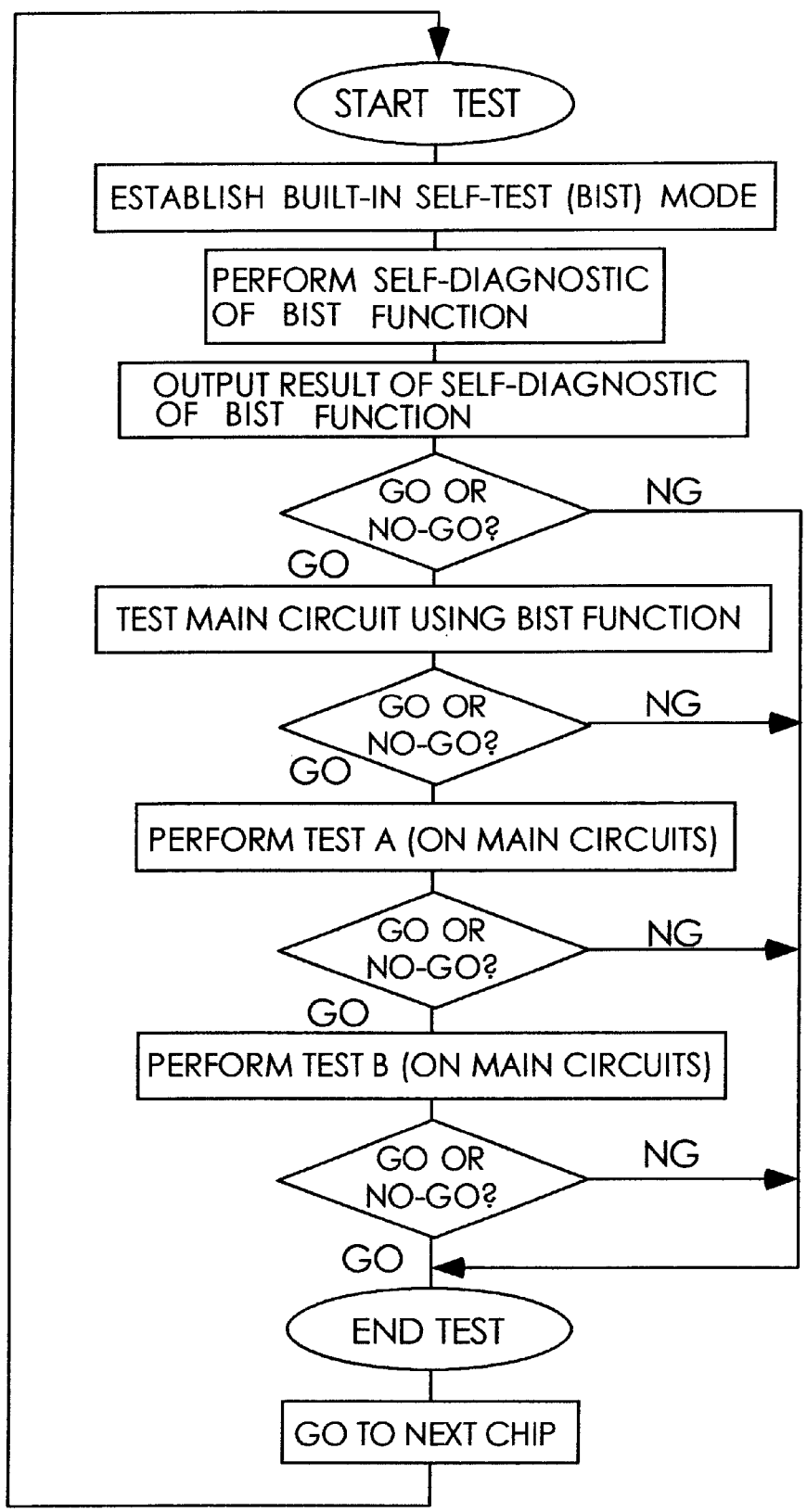
FIG. 12 is a flowchart of steps constituting a conventional method for testing semiconductor devices incorporating a built-in self-test function each.

FIG. 11 is a schematic view showing how the inventive testing tools are in contact with the probes. In FIG. 11, reference numeral 60 indicates a contact bump in contact with the semiconductor device 44 judged faulty upon testing in the BIST mode. In this case, the second contact sheet 54 is removed to let the probes 58 come into contact individually with the contact bump 60.

The ATE 10 then sends a signal to the selector circuit 36 of the semiconductor device 44 judged faulty in the BIST mode in order to switch the signal path to the main circuit part 32. With the external signal test mode brought into effect, the main circuits 32 (i.e., memory portion 32a and logic portion 32b) are tested. The result of the test in the external signal test mode is sent to the ATE 10.

The steps above are carried out on all semiconductor devices 44 judged defective in the BIST mode. The results of the test in the BIST mode and of the test in the external signal test mode are put together for an overall judgment. Specifically, of the semiconductor devices 44 judged faulty in the BIST mode, those judged normal by the main circuit test in the external signal test mode are ultimately judged acceptable.

FIG. 10C is a schematic view showing how the overall judgment is illustratively performed. The criteria for judgment with the third embodiment are the same as those with the first embodiment.

As described, in addition to the benefits offered by the first embodiment, the third embodiment permits collective and concurrent testing of all chips on a wafer. This reduces the testing time and enhances productivity. Because the semiconductor devices whose BIST function was judged NO-GO are individually tested for main circuit compliance, it is possible to determine whether each semiconductor device is ultimately NO-GO. This helps prevent an inordinate decline in yield rates.

The above-described inventive semiconductor device testing method and semiconductor device testing apparatus are recapitulated below in constitution together with some major benefits offered thereby.

According to one aspect of the invention, there is provided a semiconductor device testing method applied to a plurality of semiconductor devices on a wafer, each of the semiconductor devices including a main circuit part, a test function part for testing the main circuit part, and a switching circuit part for switching a test signal either to the main circuit part or to the test function part upon receipt of an external signal, the method comprising the steps of: firstly sending a test signal through the switching circuit part of a given semiconductor device to the test function part thereof thereby subjecting the test function part to a self-diagnostic and testing the main circuit part using the test function part for compliance with relevant requirements, judging the semiconductor device in question to be faulty if either the self-diagnostic of the test function part or the test on the main circuit part by the test function part has produced an abnormal result, and the result of the testing being saved; secondly supplying the main circuit part of the semiconductor device judged faulty in the first step with a test signal through the switching circuit part thereby testing the main circuit part for compliance with the requirements; and thirdly judging the semiconductor device to be normal if the main circuit part thereof was judged normal in the second step. This method eliminates the possibility that any chip with normal main circuits can be rejected as defective if the result of the self-diagnostic of the built-in test function part turns out to be abnormal. The inventive testing method thus circumvents high rates of semiconductor devices getting falsely rejected because of their flawed built-in self-test circuits and thereby improves the yield rates of the devices. That in turn makes it possible to fabricate highly reliable and inexpensive semiconductor devices with the built-in self-test function.

In one preferred variation of the inventive semiconductor device testing method, some of a plurality of semiconductor devices on a wafer are selected as a group corresponding to probes of a testing apparatus so that the grouped semiconductor devices are brought into contact individually and concurrently with said probes, before said first step is performed on each of the grouped semiconductor devices, the first step being repeated successively on different groups of all semiconductor devices; and wherein any semiconductor device judged faulty in the first step is subjected to the second step after the semiconductor device in question is brought into contact with the probes, the second step being repeated on each of all semiconductor devices judged faulty in said first step. This variation of the inventive method eliminates the need for using specialized tools in the testing and makes it possible through relatively easy testing procedures to fabricate highly reliable and inexpensive semiconductor devices with the built-in self-test function.

In another variation of the inventive semiconductor device testing method, some of a plurality of semiconductor devices on a wafer are selected as a group corresponding to probes of a testing apparatus so that the grouped semiconductor devices are brought into contact individually and concurrently with the probes, before the first step is performed on each of the grouped semiconductor devices; and the second step is performed with the probes kept in place if any semiconductor device in the group is judged faulty in the first step, the first and the second step being repeated successively on different groups of all semiconductor devices. This variation of the inventive method shortens the time it takes to move the probes of the testing apparatus and reduces the number of times chips are brought into contact with the probes, thereby minimizing any damage to the pads of the chips. Furthermore, this variation of the method makes it possible to fabricate highly reliable and inexpensive semiconductor devices with the built-in self-test function through appreciably shorted processes.

In a further variation of the inventive semiconductor device testing method, all semiconductor devices on a wafer are selected so that appropriate contact terminals attached individually to semiconductor devices are brought into contact with probes of a testing apparatus, before the first step is performed collectively on all semiconductor devices; and any semiconductor device judged faulty in the first step is subjected to the second step after the semiconductor device in question is brought into contact individually with the probes, the second step being repeated on each of all semiconductor devices judged faulty in the first step. This variation of the inventive method shortens testing time and thereby improves productivity, which makes it possible to fabricate highly reliable and inexpensive semiconductor devices with the built-in self-test function.

According to another aspect of the invention, there is provided a semiconductor device testing apparatus comprising: a drive element that carries a wafer including a plurality of semiconductor devices each having a main circuit part, a test function part for testing the main circuit part, and a switching circuit part for switching a test signal either to the main circuit part or to the test function part upon receipt of an external signal, the drive element further moving the semiconductor device of the wafer to suitable position; a signal transmission element that transmits signals to suitable semiconductor devices on the wafer carried by the drive element; and a central processing element that sends a test signal through the switching circuit part of a semiconductor device suitably positioned by the drive element, to the test function part of the device in question thereby subjecting the test function part to a self-diagnostic and testing the main circuit part using the test function part for compliance with relevant requirements, before judging the semiconductor device in question to be faulty in a first judging step if either the self-diagnostic of the test function part or the test on the main circuit part by the test function part has produced an abnormal result, the result of the testing being saved; the central processing element further moving the drive element up to the position of any semiconductor device judged faulty in the first judging step and supplying the main circuit part of the semiconductor device in question with a test signal through the switching circuit part thereby testing the main circuit part in a second judging step; the central processing element further judging the semiconductor device to be normal if the main circuit part thereof was judged normal in the second judging step. This inventive testing apparatus does not reject semiconductor devices as defective if the self-diagnostic of their test function part produces an abnormal result while their main circuits are judged normal. The apparatus averts high rates of semiconductor devices getting falsely rejected because of abnormal results of the self-diagnostic on their test function part. That in turn makes it possible to fabricate highly reliable and inexpensive semiconductor devices with the built-in self-test function.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-375980, filed on Dec. 11, 2000 including specification, claims, drawings and summary, on which the Convention priority of the present application is based, are incorporated herein by reference in its entirety.

What is claimed is:

1. A method for testing semiconductor devices disposed on a wafer, each of the semiconductor devices including a main circuit part, a test function part for testing the main circuit part, and a switching circuit part for switching a signal path either to the main circuit part or to the test function part upon receipt of an external signal from outside of the semiconductor devices, the method comprising the steps of:

firstly sending a first test signal from outside of the semiconductor devices through the switching circuit part of a given semiconductor device to the test function part thereof, subjecting the test function part to a self-diagnostic and testing the main circuit part using the test function part, judging the semiconductor device to be faulty if either the self-diagnostic of the test function part or the test on the main circuit part by the test function part has produced an abnormal result;

secondly supplying the main circuit part of the semiconductor device judged faulty in said first step with a second test signal from outside of the semiconductor devices through the switching circuit part, and judging the main circuit part judged faulty in said first step by testing the main circuit part using the second test signal; and thirdly judging the semiconductor device judged faulty in said first step to be normal if the main circuit part thereof was judged normal in said second step.

2. The method for testing semiconductor devices according to claim 1 further comprising the steps of:

(a) selecting some of a plurality of semiconductor devices on a wafer as a group corresponding to probes of a testing apparatus;

(b) bringing the grouped semiconductor devices into contact individually and concurrently with the probes, whereby a signal path is formed between the testing apparatus and said semiconductor devices;

(c) performing said first step on each of the grouped semiconductor devices;

(d) repeating step (a) to step (c) until performing successively on different groups of all semiconductor devices;

(e) subjecting any semiconductor device judged faulty in said first step to said second step; and (f) repeating said second step on each of all semiconductor devices judged faulty in said first step.

3. The method for testing semiconductor devices according to claim 1 further comprising the steps of:

(a) selecting some of a plurality of semiconductor devices on a wafer as a group corresponding to probes of a testing apparatus (b) bringing the grouped semiconductor devices into contact individually and concurrently with said probes whereby a signal path is formed between the testing apparatus and said semiconductor devices;

(c) performing said first step on each of the grouped semiconductor devices;

(d) performing said second step with the probes kept in place if any semiconductor device in the group is judged faulty in said first step; and (e) repeating step (a) to step (d) until performing successively on different groups of all semiconductor devices.

4. The method for testing semiconductor devices according to claim 1 further comprising the steps of:

(a) selecting all semiconductor devices on a wafer;

(b) bringing appropriate contact terminals attached individually to all semiconductor devices into contact with probes of a testing apparatus, whereby a signal path is formed between the testing apparatus and said semiconductor devices;

(c) performing said first step collectively on all semiconductor devices; and (d) performing said second step with the probes kept in place on each of all semiconductor devices judged faulty in said first step.

5. An apparatus for testing semiconductor devices comprising:

a drive part that carries a wafer including a plurality of semiconductor devices each having a main circuit part, a test function part for testing the main circuit part, and a switching circuit part for switching a signal path either to the main circuit part or to the test function part upon receipt of an external signal from outside of the semiconductor devices, said drive part further moving the semiconductor device of the wafer to a suitable position;

a signal transmission part that transmits external signals and test signals to suitable semiconductor devices on the wafer carried by said drive part; and a central processing part configured to perform the following steps:
(a) sending a first test signal to the test function part of a semiconductor device through the switching circuit part of the device,
(b) responsive to the first test signal, subjecting the test function part to a self-diagnosis and testing the main circuit part using the test function part,
(c) judging the semiconductor device to be faulty if either the self-diagnostic of the test function part or the test on the main circuit part by the test function part has produced an abnormal result,
(d) supplying the main circuit part of any semiconductor device judged faulty in step
(c) with a second test signal through the switching circuit part,
(e) judging the main circuit part of the device judged faulty in step (c) based on testing the main circuit part thereof using the second test signal, and
(f) judging the semiconductor device judged faulty in step (c) to be normal if the main circuit part is judged to be normal in step (e).

6. A method for testing a semiconductor device disposed on a wafer, the semiconductor device including a main circuit part and a test function part configured for testing the main circuit part, the method comprising the machine-implemented steps of:

sending a first signal to the test function part of the semiconductor device to initiate a diagnostic test on the test function part;

responsive to an abnormal result of the diagnostic test, sending a second signal to initiate a test on the main circuit part; and determining a test status of the semiconductor device based on a result of the test on the main circuit part.

7. A semiconductor device testing apparatus for testing a semiconductor device disposed on a wafer, the semiconductor device including a main circuit part and a test function part configured for testing the main circuit part, the semiconductor device testing apparatus comprising:

a drive part configured to carry the wafer and move the semiconductor device on the wafer to a suitable position for testing;

a signal transmission part for transmitting signals to the semiconductor device on the wafer; and a central processing element configured to carry out the machine-machine implemented steps of:
sending a first signal to initiate a diagnostic test on the test function part;
responsive to an abnormal result of the diagnostic test, sending a second signal to initiate a test on the main circuit part; and
determining a test status of the semiconductor device based on a result of the test on the main circuit part.

* * * * *

UNITED STATES PATENT AND TRADEMARK OFFICE
CERTIFICATE OF CORRECTION

PATENT NO.  : 6,646,461 B2
DATED       : November 11, 2003
INVENTOR(S) : Kazushi Sugiura et al.

It is certified that error appears in the above-identified patent and that said Letters Patent is hereby corrected as shown below:

<u>Title page,</u>
Item [73], Assignee, change the first assignee "Mitsubishi Denki Kabushiki Kaisha, Tokyo (JP)" to -- Renesas Technology Corp., Tokyo (JP) --

Signed and Sealed this

Twenty-fifth Day of May, 2004

JON W. DUDAS
*Acting Director of the United States Patent and Trademark Office*